United States Patent
Yamazaki

(10) Patent No.: US 9,601,602 B2
(45) Date of Patent: Mar. 21, 2017

(54) SEMICONDUCTOR DEVICE AND MANUFACTURING METHOD THEREOF

(71) Applicant: Semiconductor Energy Laboratory Co., Ltd., Atsugi-shi, Kanagawa-ken (JP)

(72) Inventor: Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/856,621

(22) Filed: Sep. 17, 2015

(65) Prior Publication Data

US 2016/0079399 A1   Mar. 17, 2016

Related U.S. Application Data

(60) Continuation of application No. 14/152,182, filed on Jan. 10, 2014, now Pat. No. 9,142,648, which is a
(Continued)

(30) Foreign Application Priority Data

May 21, 2010   (JP) .................................. 2010-117020

(51) Int. Cl.
*H01L 21/00*   (2006.01)
*H01L 29/66*   (2006.01)
(Continued)

(52) U.S. Cl.
CPC .. *H01L 29/66969* (2013.01); *H01L 21/02107* (2013.01); *H01L 21/02565* (2013.01);
(Continued)

(58) Field of Classification Search
CPC ............... H01L 27/1225; H01L 29/045; H01L 29/7869; H01L 29/66969; H01L 27/1285;
(Continued)

(56) References Cited

U.S. PATENT DOCUMENTS 5,731,856 A   3/1998 Kim et al.
5,744,864 A   4/1998 Cillessen et al.
(Continued)

FOREIGN PATENT DOCUMENTS

EP   1737044 A   12/2006
EP   2226847 A   9/2010
(Continued)

OTHER PUBLICATIONS

Asakuma.N. et al., "Crystallization and Reduction of Sol-Gel-Derived Zinc Oxide Films by Irradiation with Ultraviolet Lamp", Journal of Sol-Gel Science and Technology, 2003, vol. 26, pp. 181-184.
(Continued)

*Primary Examiner* — Thinh T Nguyen
(74) *Attorney, Agent, or Firm* — Fish & Richardson P.C.

(57) ABSTRACT

Disclosed is a semiconductor device including an oxide semiconductor film. A first oxide semiconductor film with a thickness of greater than or equal to 2 nm and less than or equal to 15 nm is formed over a gate insulating layer. First heat treatment is performed so that crystal growth from a surface of the first oxide semiconductor film to the inside thereof is caused, whereby a first crystal layer is formed. A second oxide semiconductor film with a thickness greater than that of the first oxide semiconductor film is formed over the first crystal layer. Second heat treatment is performed so that crystal growth from the first crystal layer to a surface of the second oxide semiconductor film is caused, whereby a
(Continued)

second crystal layer is formed. Further, oxygen doping treatment is performed on the second crystal layer.

16 Claims, 8 Drawing Sheets

Related U.S. Application Data division of application No. 13/110,382, filed on May 18, 2011, now Pat. No. 8,629,438.

(51) Int. Cl.

| *H01L 27/12* | (2006.01) |
|---|---|
| *H01L 29/04* | (2006.01) |
| *H01L 29/786* | (2006.01) |
| *H01L 21/441* | (2006.01) |
| *H01L 21/465* | (2006.01) |
| *H01L 21/469* | (2006.01) |
| *H01L 21/4757* | (2006.01) |
| *H01L 29/24* | (2006.01) |
| *H01L 29/423* | (2006.01) |
| *H01L 21/02* | (2006.01) |

(52) U.S. Cl.
CPC .......... *H01L 21/441* (2013.01); *H01L 21/465* (2013.01); *H01L 21/469* (2013.01); *H01L 21/4757* (2013.01); *H01L 27/1225* (2013.01); *H01L 27/1285* (2013.01); *H01L 29/045* (2013.01); *H01L 29/24* (2013.01); *H01L 29/42384* (2013.01); *H01L 29/66765* (2013.01); *H01L 29/7869* (2013.01); *H01L 21/02554* (2013.01); *H01L 21/02587* (2013.01)

(58) Field of Classification Search
CPC ............... H01L 29/66765; H01L 29/24; H01L 29/4238; H01L 21/469
USPC ........ 438/104, 150, 158, 85, 86; 257/43, 59, 257/E29.296, E21.46, 52
See application file for complete search history.

(56) References Cited

U.S. PATENT DOCUMENTS

| 6,294,274 | B1 | 9/2001 | Kawazoe et al. |
|---|---|---|---|
| 6,399,960 | B1 | 6/2002 | Yamazaki et al. |
| 6,563,174 | B2 | 5/2003 | Kawasaki et al. |
| 6,693,044 | B1 | 2/2004 | Yamazaki et al. |
| 6,727,522 | B1 | 4/2004 | Kawasaki et al. |
| 6,838,308 | B2 | 1/2005 | Haga |
| 7,002,179 | B2 | 2/2006 | Nakahara |
| 7,019,385 | B1* | 3/2006 | Zhang ............... G02F 1/136227 257/347 |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,157,307 | B2 | 1/2007 | Ishizaki |
| 7,211,825 | B2 | 5/2007 | Shih et al |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,601,984 | B2 | 10/2009 | Sano et al. |
| 7,674,650 | B2 | 3/2010 | Akimoto et al. |
| 7,732,819 | B2 | 6/2010 | Akimoto et al. |
| 7,791,072 | B2 | 9/2010 | Kumomi et al. |
| 7,884,360 | B2* | 2/2011 | Takechi ............... H01L 29/4908 257/52 |
| 7,923,722 | B2 | 4/2011 | Ryu et al. |
| 7,935,964 | B2 | 5/2011 | Kim et al. |
| 7,994,500 | B2 | 8/2011 | Kim et al. |
| 8,058,645 | B2* | 11/2011 | Jeong ................... H01L 27/1225 257/43 |
| 8,093,589 | B2 | 1/2012 | Sugihara et al. |
| 8,129,719 | B2 | 3/2012 | Yamazaki et al. |
| 8,148,779 | B2 | 4/2012 | Jeong et al. |
| 8,188,480 | B2 | 5/2012 | Itai |
| 8,202,365 | B2 | 6/2012 | Umeda et al. |
| 8,203,143 | B2 | 6/2012 | Imai |
| 8,222,092 | B2 | 7/2012 | Yamazaki et al. |
| 8,236,627 | B2 | 8/2012 | Tsubuku et al. |
| 8,247,813 | B2 | 8/2012 | Koyama et al. |
| 8,253,134 | B2 | 8/2012 | Kim et al. |
| 8,274,078 | B2 | 9/2012 | Itagaki et al. |
| 8,293,595 | B2 | 10/2012 | Yamazaki et al. |
| 8,293,661 | B2 | 10/2012 | Yamazaki |
| 8,362,563 | B2 | 1/2013 | Kondo et al. |
| 8,367,489 | B2 | 2/2013 | Yamazaki |
| 8,420,442 | B2* | 4/2013 | Takechi ............... H01L 29/4908 438/104 |
| 8,440,510 | B2 | 5/2013 | Yamazaki |
| 8,822,264 | B2 | 9/2014 | Yamazaki et al. |
| 8,841,710 | B2 | 9/2014 | Yamazaki et al. |
| 8,889,480 | B2 | 11/2014 | Takechi et al. |
| 9,209,026 | B2 | 12/2015 | Takechi et al. |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager, III et al. |
| 2004/0023432 | A1* | 2/2004 | Haga ................... C03C 17/3417 438/104 |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199880 | A1 | 9/2005 | Hoffman et al. |
| 2005/0199959 | A1 | 9/2005 | Chiang et al. |
| 2005/0275038 | A1 | 12/2005 | Shih et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0072439 | A1 | 3/2007 | Akimoto et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |

(56) References Cited

U.S. PATENT DOCUMENTS

| | | |
|---|---|---|
| 2007/0272922 A1* | 11/2007 | Kim .................. H01L 29/7869 257/43 |
| 2007/0287221 A1 | 12/2007 | Ong et al. |
| 2007/0287296 A1 | 12/2007 | Chang |
| 2008/0006877 A1 | 1/2008 | Mardilovich et al. |
| 2008/0038882 A1* | 2/2008 | Takechi ............ H01L 29/4908 438/151 |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0237598 A1 | 10/2008 | Nakayama |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0057663 A1 | 3/2009 | Kim et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2009/0283763 A1 | 11/2009 | Park et al. |
| 2009/0321731 A1 | 12/2009 | Jeong et al. |
| 2009/0321732 A1 | 12/2009 | Kim et al. |
| 2010/0006833 A1 | 1/2010 | Ha et al. |
| 2010/0038641 A1 | 2/2010 | Imai |
| 2010/0044699 A1 | 2/2010 | Chung et al. |
| 2010/0051937 A1 | 3/2010 | Kaji et al. |
| 2010/0051940 A1 | 3/2010 | Yamazaki et al. |
| 2010/0059746 A1 | 3/2010 | Itai |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0109003 A1 | 5/2010 | Akimoto et al. |
| 2010/0163863 A1 | 7/2010 | Yaegashi |
| 2010/0295041 A1 | 11/2010 | Kumomi et al. |
| 2010/0320458 A1 | 12/2010 | Umeda et al. |
| 2010/0320459 A1 | 12/2010 | Umeda et al. |
| 2011/0062436 A1 | 3/2011 | Yamazaki et al. |
| 2011/0089416 A1 | 4/2011 | Yamazaki et al. |
| 2011/0127521 A1 | 6/2011 | Yamazaki |
| 2011/0127523 A1 | 6/2011 | Yamazaki |
| 2011/0127579 A1 | 6/2011 | Yamazaki |
| 2011/0133191 A1 | 6/2011 | Yamazaki |
| 2011/0151618 A1 | 6/2011 | Yamazaki et al. |
| 2011/0193083 A1 | 8/2011 | Kim et al. |
| 2011/0215328 A1 | 9/2011 | Morosawa et al. |
| 2011/0215331 A1 | 9/2011 | Yamazaki et al. |
| 2011/0217815 A1 | 9/2011 | Honda et al. |
| 2011/0260171 A1 | 10/2011 | Yamazaki |
| 2011/0263082 A1 | 10/2011 | Yamazaki |
| 2011/0263083 A1 | 10/2011 | Yamazaki |
| 2011/0263084 A1 | 10/2011 | Yamazaki |
| 2011/0263085 A1 | 10/2011 | Yamazaki |
| 2011/0263091 A1 | 10/2011 | Yamazaki |
| 2011/0269266 A1 | 11/2011 | Yamazaki |
| 2011/0281394 A1 | 11/2011 | Yamazaki |
| 2012/0052624 A1 | 3/2012 | Yamazaki |
| 2012/0064665 A1 | 3/2012 | Yamazaki |
| 2012/0119205 A1 | 5/2012 | Taniguchi et al. |
| 2013/0015438 A1 | 1/2013 | Yamazaki |
| 2013/0082256 A1 | 4/2013 | Yamazaki |
| 2013/0099234 A1 | 4/2013 | Yamazaki |
| 2015/0050774 A1 | 2/2015 | Yamazaki et al. |
| 2015/0060850 A1 | 3/2015 | Yamazaki et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-237456 A | 10/1988 |
| JP | 63-239117 A | 10/1988 |
| JP | 63-265818 A | 11/1988 |
| JP | 05-251705 A | 9/1993 |
| JP | 08-088174 A | 4/1996 |
| JP | 08-264794 A | 10/1996 |
| JP | 10-335325 A | 12/1998 |
| JP | 11-505377 | 5/1999 |
| JP | 11-204435 A | 7/1999 |
| JP | 2000-026119 A | 1/2000 |
| JP | 2000-044236 A | 2/2000 |
| JP | 2000-150900 A | 5/2000 |
| JP | 2002-076356 A | 3/2002 |
| JP | 2002289859 A | 10/2002 |
| JP | 2003-041362 A | 2/2003 |
| JP | 2003-086000 A | 3/2003 |
| JP | 2003-086808 A | 3/2003 |
| JP | 2003-298062 A | 10/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-123861 A | 5/2007 |
| JP | 2007-281486 A | 10/2007 |
| JP | 2008-042088 A | 2/2008 |
| JP | 2008-098447 A | 4/2008 |
| JP | 2009-033120 A | 2/2009 |
| JP | 2009-088106 A | 4/2009 |
| JP | 2009-094535 A | 4/2009 |
| JP | 2009-167087 A | 7/2009 |
| JP | 2009-231613 A | 10/2009 |
| JP | 2009-295997 A | 12/2009 |
| JP | 2010-016347 A | 1/2010 |
| JP | 2010-040552 A | 2/2010 |
| JP | 4415062 | 2/2010 |
| JP | 2010-056546 A | 3/2010 |
| JP | 2010-067954 A | 3/2010 |
| JP | 2010-080947 A | 4/2010 |
| JP | 2010-177431 A | 8/2010 |
| JP | 4571221 | 10/2010 |
| JP | 2012-160679 A | 8/2012 |
| WO | WO-2004/114391 | 12/2004 |
| WO | WO-2008/133345 | 11/2008 |
| WO | WO-2009/034953 | 3/2009 |

OTHER PUBLICATIONS

Asaoka.Y et al., "29.1: Polarizer-Free Reflective LCD Combined With Ultra Low-Power Driving Technology", SID Digest '09 : SID International Symposium Digest of Technical Papers, May 31, 2009, and pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

(56) References Cited

OTHER PUBLICATIONS

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature ", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kimizuka.N. et al., "Spinel,YbFe2O4, and Yb2Fe3O7 Types of Structures for Compounds in the In2O3 and Sc2O3—A2O3—Bo Systems [A; Fe, Ga, or Al; B: Mg, Mn, Fe, Ni, Cu,or Zn] at Temperatures over 1000° C.", Journal of Solid State-Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World'S Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "Suftla Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M, "Synthesis of Homologous Compound with New Long-Period Structure", NIRIM Newsletter, Mar. 1, 1995, vol. 150, pp. 1-4.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

(56) References Cited

OTHER PUBLICATIONS

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Ohara.H et al., "21.3:4.0 In QVGA AMOLED Display Using In—Ga—Zn-Oxide TFTS With a Novel Passivation Layer", SID Digest '09 : SID International Symposium Digest of Technical Papers, May 31, 2009, pp. 284-287.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.J et al., "Amorphous Indium-Gallium-Zinc Oxide TFTS and Their Application for Large Size AMOLED", AM-FPD '08 Digest of Technical Papers, Jul. 2, 2008, pp. 275-278.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.S et al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTS", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Nakayama et al., "17a-TL-8 Effect of GaO Layer on IGZO-TFT Channel", Extended Abstracts (The 57th Spring Meeting 2010), The Japan Society of Applied Physics and Related Societies, Mar. 17, 2010, pp. 21-008

* cited by examiner

SEMICONDUCTOR DEVICE AND MANUFACTURING METHOD THEREOF

CROSS-REFERENCE TO RELATED APPLICATIONS

This application is a continuation of U.S. application Ser. No. 14/152,182, filed Jan. 10, 2014, now allowed, which is a divisional of U.S. application Ser. No. 13/110,382, filed May 18, 2011, now U.S. Pat. No. 8,629,438, which claims the benefit of a foreign priority application filed in Japan as Serial No. 2010-117020 on May 21, 2010, all of which are incorporated by reference.

BACKGROUND OF THE INVENTION

1. Field of the Invention

The present invention relates to a semiconductor device including an oxide semiconductor and a manufacturing method thereof.

In this specification, a semiconductor device generally means a device which can function by utilizing semiconductor characteristics, and an electrooptic device, a semiconductor circuit, and an electronic appliance are all semiconductor devices.

2. Description of the Related Art

In recent years, attention has been focused on a technique for forming thin film transistors (TFTs) using a thin semiconductor film (with a thickness of from several tens of nanometers to several hundreds of nanometers, approximately) formed over a substrate having an insulating surface. Thin film transistors are widely applied to electronic devices such as an IC and an electro-optical device and have been expected to be rapidly developed particularly as switching elements for an image display device. Various metal oxides are used for a variety of applications.

Some metal oxides have semiconductor characteristics. The examples of such metal oxides having semiconductor characteristics are a tungsten oxide, a tin oxide, an indium oxide, a zinc oxide, and the like. A thin film transistor whose channel formation region includes such metal oxides having semiconductor characteristics is already known (Patent Documents 1 and 2).

REFERENCE

[Patent Document 1] Japanese Published Patent Application No. 2007-123861
[Patent Document 2] Japanese Published Patent Application No. 2007-096055

SUMMARY OF THE INVENTION

However, the electric conductivity of an oxide semiconductor changes when hydrogen or water forming an electron donor enters the oxide semiconductor during a process for manufacturing a device. Such a phenomenon becomes a factor of variation in the electric characteristics of a transistor including the oxide semiconductor.

In view of the above problems, one object is to provide a semiconductor device including an oxide semiconductor film, which has stable electric characteristics and high reliability.

One embodiment of the disclosed invention is a method for manufacturing a semiconductor device including the following steps: forming a gate electrode layer; forming a gate insulating layer over the gate electrode layer; forming a first oxide semiconductor film with a thickness of greater than or equal to 2 nm and less than or equal to 15 nm over the gate insulating layer; forming a first crystal layer by performing first heat treatment so that crystal growth from a surface of the first oxide semiconductor film to an inside of the first oxide semiconductor film is caused; forming a second oxide semiconductor film with a thickness greater than that of the first oxide semiconductor film over the first crystal layer; forming a second crystal layer by performing second heat treatment so that crystal growth from the first crystal layer to a surface of the second oxide semiconductor film which is over the first crystal layer is caused; forming a source electrode layer and a drain electrode layer over a stacked layer of the first crystal layer and the second crystal layer; and performing oxygen doping treatment to supply an oxygen atom to the second crystal layer after forming the second crystal layer.

Note that in the above manufacturing method, a high-density oxide semiconductor film can be obtained by crystallization through the first heat treatment or the second heat treatment. Then, oxygen doping treatment is performed on the high-density oxide semiconductor film to supply an oxygen atom to the oxide semiconductor film, and performing heat treatment on the oxide semiconductor film to which the oxygen atom is supplied.

Another embodiment of the disclosed invention is a method for manufacturing a semiconductor device including the following steps: forming a gate electrode layer; forming a gate insulating layer over the gate electrode layer; performing halogen doping treatment on the gate insulating layer; forming a first oxide semiconductor film with a thickness of greater than or equal to 2 nm and less than or equal to 15 nm over the gate insulating layer: forming a first crystal layer by performing first heat treatment so that crystal growth from a surface of the first oxide semiconductor film to the inside of the first oxide semiconductor film is caused; forming a second oxide semiconductor film with a thickness greater than that of the first oxide semiconductor film over the first crystal layer: forming a second crystal layer by performing second heat treatment so that crystal growth from the first crystal layer to a surface of the second oxide semiconductor film which is over the first crystal layer is caused; and forming a source electrode layer and a drain electrode layer over a stacked layer of the first crystal layer and the second crystal layer.

Note that in the above manufacturing method, oxygen might be released from the gate insulating layer depending on the conditions of the first heat treatment; therefore, it is useful to prevent reduction of oxygen in the gate insulating layer by adding chlorine with a large mass to the gate insulating layer before the first heat treatment. Further, oxygen doping treatment may be performed after the second heat treatment.

In this specification, a halogen element means an element belonging to Group 17 in the periodic table (such as fluorine (F), chlorine (Cl), bromine (Br), or iodine (I)); typically, fluorine or chlorine can be used, and one kind of halogen element or a plurality of kinds of halogen elements may be used.

A halogen element is added to a gate insulating layer by performing halogen doping treatment in a gas atmosphere containing a halogen element. Note that the above "halogen doping" means to add halogen typified by chlorine and fluorine to a bulk. For example, in the case where chlorine is used as halogen, at least one of a chlorine radical, a chlorine atom, and a chlorine ion is added to a bulk. The term "bulk" is used in order to clarify that halogen is added to the inside of a thin film in addition to a surface of the thin film. Further, the term "halogen doping" includes "halogen plasma doping" by which halogen which is made to be plasma is added to a bulk. In addition, a halogen element can be contained in the gate insulating layer when the gate insulating layer is deposited.

One of the characteristics of each of the above manufacturing methods is that the first crystal layer is c-axis aligned perpendicularly to the surface thereof. One of the characteristics of each of the above manufacturing methods is that the second crystal layer is c-axis aligned perpendicularly to the surface thereof.

Note that the above "oxygen doping" means that oxygen (which includes at least one of an oxygen radical, an oxygen atom, and an oxygen ion) is added to a bulk. The term "bulk" is used in order to clarify that oxygen is added to the inside of a thin film in addition to a surface of the thin film. Further, the term "oxygen doping" includes "oxygen plasma doping" by which oxygen which is made to be plasma is added to a bulk.

By the above oxygen doping treatment, oxygen whose amount is greater than the stoichiometric proportion exists in at least one of the oxide semiconductor film (a bulk thereof), the insulating film (a bulk thereof), and an interface between the oxide semiconductor film and the insulating film. The amount of oxygen is preferably greater than the stoichiometric proportion and less than four times of the stoichiometric proportion, more preferably greater than the stoichiometric proportion and less than double of the stoichiometric proportion. Here, as an example of an oxide containing excessive oxygen whose amount is greater than the stoichiometric proportion, an oxide which satisfies $g>3a+3b+2c+4d+3e+2f$ can be given when the composition of the oxide is expressed by $In_aGa_bZn_cSi_dAl_eMg_fO_g$ (a, b, c, d, e, f, g≥0) in appearance. An oxide containing composition other than the above may be considered in a similar manner. Note that oxygen added by the oxygen doping treatment may exist between lattices of the oxide semiconductor.

One embodiment of the present invention is a semiconductor device obtained by the above method for manufacturing a semiconductor device, in which the halogen doping treatment is performed. The semiconductor device includes the following components: a gate insulating layer which contains a halogen element and which is provided over a gate electrode layer; a first crystal layer which has an a-b plane parallel to a surface and which is c-axis aligned perpendicularly to the surface and provided over the gate insulating layer; a second crystal layer which is c-axis aligned perpendicularly to a surface and provided over and which is in contact with the first crystal layer; and a source electrode layer and a drain electrode layer provided over a stacked layer of the first crystal layer and the second crystal layer. In addition, each of the first crystal layer and the second crystal layer is an oxide semiconductor film.

As a material of the oxide semiconductor films that are the first crystal layer and the second crystal layer, any of the following materials can be used: a four-component metal oxide such as an In—Sn—Ga—Zn—O-based material; three-component metal oxides such as an In—Ga—Zn—O-based material, an In—Sn—Zn—O-based material, an In—Al—Zn—O-based material, a Sn—Ga—Zn—O-based material, an Al—Ga—Zn—O-based material, and a Sn—Al—Zn—O-based material; two-component metal oxides such as an In—Zn—O-based material, a Sn—Zn—O-based material, an Al—Zn—O-based material, a Zn—Mg—O-based material, a Sn—Mg—O-based material, an In—Mg—O-based material, and an In—Ga—O-based material; a single-component metal oxide such as an In—O-based material and a Sn—O-based material; and the like. In addition, the above materials may contain $SiO_2$. Here, for example, an In—Ga—Zn—O-based material means an oxide containing indium (In), gallium (Ga), and zinc (Zn), and there is no particular limitation on the composition ratio thereof. Further, the In—Ga—Zn—O-based oxide semiconductor may contain an element other than In, Ga, and Zn.

In the case where an In—Zn—O-based material is used as an oxide semiconductor, a target therefor has a composition ratio of In:Zn=50:1 to 1:2 in an atomic ratio ($In_2O_3$:ZnO=25:1 to 1:4 in a molar ratio), preferably In:Zn=20:1 to 1:1 in an atomic ratio ($In_2O_3$:ZnO=10:1 to 1:2 in a molar ratio), further preferably In:Zn=15:1 to 1.5:1 in an atomic ratio ($In_2O_3$:ZnO=15:2 to 3:4 in a molar ratio). For example, in a target used for formation of an In—Zn—O-based oxide semiconductor which has an atomic ratio of In:Zn:O=X:Y:Z, the relation of $Z>1.5X+Y$ is satisfied.

An entrapment vacuum pump is preferably used for evacuating a deposition chamber when the gate insulating layer and/or the first crystal layer and/or the second crystal layer, and/or the insulating layer are/is manufactured in the above method for manufacturing a semiconductor device. For example, a cryopump, an ion pump, or a titanium sublimation pump is preferably used. The above entrapment vacuum pump functions so as to reduce the amount of hydrogen, water, hydroxyl, or hydride contained in the gate insulating layer and/or the oxide semiconductor film and/or the insulating layer.

The amount of change in the threshold voltage of a transistor including an oxide semiconductor film which is crystallized and made highly dense can be reduced between before and after a bias-temperature stress (BT) test, whereby a semiconductor device using an oxide semiconductor which has stable electric characteristics can be provided.

DETAILED DESCRIPTION OF THE INVENTION

Hereinafter, embodiments of the present invention will be described in detail with reference to the accompanying drawings. However, the present invention is not limited to the description below, and it is easily understood by those skilled in the art that modes and details disclosed herein can be modified in various ways. The present invention is not construed as being limited to the description of the embodiments described below.

(Embodiment 1)

In this embodiment, a method for manufacturing a semiconductor device will be described with reference to FIGS. 1A to 1F.

Figure 1A:
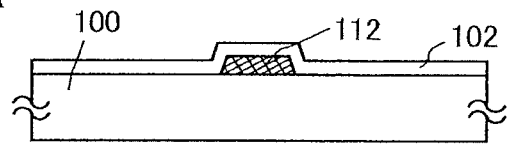
FIGS. 1A to 1F are cross-sectional views showing steps of one embodiment of the present invention.

First, a conductive film is formed over a substrate 100 having an insulating surface, and then a gate electrode layer 112 is formed through a photolithography step (see FIG. 1A). Note that a resist mask may be formed by an inkjet method. Formation of the resist mask by an inkjet method needs no photomask; thus, manufacturing cost can be reduced.

There is no particular limitation on the property of a material and the like of the substrate 100 as long as the material has at least heat resistance high enough to withstand heat treatment performed later. For example, a glass substrate, a ceramic substrate, a quartz substrate, or a sapphire substrate can be used as the substrate 100. Alternatively, a single crystal semiconductor substrate or a polycrystalline semiconductor substrate made of silicon, silicon carbide, or the like; a compound semiconductor substrate made of silicon germanium or the like; an SOI substrate; or the like may be used as the substrate 100. Still alternatively, any of these substrates provided with a semiconductor element may be used as the substrate 100.

An insulating film serving as a base film may be provided between the substrate 100 and the gate electrode layer 112. The base film has a function of preventing diffusion of an impurity element from the substrate 100, and can be formed to have a single-layer structure or a stacked-layer structure using one or more films selected from a silicon nitride film, a silicon oxide film, a silicon nitride oxide film, and a silicon oxynitride film.

The gate electrode 112 can be formed by a plasma CVD method, a sputtering method, or the like. The gate electrode layer 112 can be formed to have a single-layer structure or a stack-layer structure using a metal material such as molybdenum, titanium, tantalum, tungsten, aluminum, copper, neodymium, or scandium, or an alloy material which contains any of these materials as a main component.

Next, a gate insulating layer 102 is formed over the gate electrode 112 layer (see FIG. 1A).

An insulating material whose etching rate in etching for a selective etching of an oxide semiconductor film is significantly different from that of an oxide semiconductor film formed later is preferably used for the gate insulating layer 102. The gate insulating layer 102 can be formed with a single-layer structure or a stacked-layer structure using silicon oxide, silicon nitride, silicon oxynitride, silicon nitride oxide, aluminum oxide, aluminum nitride, aluminum oxynitride, aluminum nitride oxide, hafnium oxide, or a mixed material thereof by a plasma CVD method, a sputtering method, or the like. Considering that the gate insulating layer 102 functions as a gate insulating layer of a transistor, a material having a high dielectric constant such as hafnium oxide, tantalum oxide, yttrium oxide, hafnium silicate ($HfSi_xO_y$ (x>0, y>0)), hafnium aluminate ($HfAl_xO_y$, (x>0, y>0)), hafnium silicate to which nitrogen is added, or hafnium aluminate to which nitrogen is added may be employed. A sputtering method is preferable in terms of low possibility of entry of hydrogen, water, and the like.

Alternatively, a stacked-layer of an insulating film formed of the above material and a gallium oxide film may be used as the gate insulating layer 102.

Figure 1B:
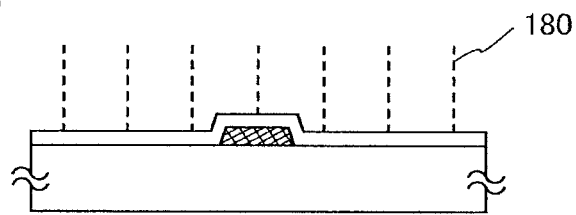

Next, treatment with halogen 180 (also referred to as halogen doping treatment or halogen plasma doping treatment) is performed on the gate insulating layer 102, whereby halogen is contained in the gate insulating layer 102 (see FIG. 1B). Chlorine, fluorine, or the like can be used as the halogen 180. Since the electronegativity of halogen such as chlorine or fluorine is large, a hydrogen ion which causes deterioration in a transistor can be trapped. When halogen such as chlorine is contained in the gate insulating layer 102, hydrogen in the gate insulating layer 102 is fixed, and diffusion of the hydrogen from the gate insulating layer 102 into the oxide semiconductor film, which is formed over and in contact with the gate insulating layer 102 in a later step, can be prevented. Consequently, deterioration in the characteristics of a transistor is suppressed or reduced even when light irradiation is performed on the transistor and BT stress is applied thereto.

Here, since the atomic radius of chlorine is larger than that of fluorine and the diffusion coefficient of chlorine is smaller than that of fluorine, a hydrogen ion is easily fixed in the gate insulating layer 102 by chlorine. In particular, when heat treatment is performed later, chlorine is less likely to move compared to fluorine; therefore, a hydrogen ion can be trapped more effectively. Consequently, chlorine is preferably used as the halogen 180. In this embodiment, chlorine is used as the halogen 180. In the case where chlorine is used as the halogen 180, at least any of a chlorine radical, a chlorine atom, and a chlorine ion is included in the halogen 180.

The above-described treatment with the halogen 180 can be performed by a plasma generating apparatus or an ozone generating apparatus. Specifically, for example, the gate insulating layer 102 can be processed by generating the halogen 180 using an apparatus capable of performing etching treatment on a semiconductor device, an apparatus capable of performing ashing on a resist mask, or the like. Note that addition of the halogen is preferably performed under a condition that damage to a surface of the gate insulating layer 102 is minimized.

In order to add halogen more preferably, it is preferable to apply an electrical bias to a substrate when treatment with halogen is performed. Halogen can be deeply added by increasing the bias applied to the substrate.

In the case where chlorine is added using an inductively coupled plasma (ICP) apparatus, it is preferable to apply high frequency power supply of greater than or equal to 1 kW and less than or equal to 10 kW to an ICP coil that is a plasma generation source, and to keep a state where the plasma is generated for a certain period (greater than or equal to 30 seconds and less than or equal to 600 seconds). For example, chlorine doping treatment may be performed under conditions that ICP power is 6000 W, bias power is 250 W, chlorine gas flow rate is 500 sccm, pressure of a treatment chamber is 1.3 Pa, and treatment time is 60 seconds.

Halogen may be added by performing irradiation with a halogen ion accelerated by an electric field. In addition, a high-density plasma CVD method using microwaves (for example, a frequency of 2.45 GHz) may be employed to add halogen. In the case where a high-density plasma CVD method using microwaves is employed, a stacked layer of oxide semiconductor films is hardly damaged at the addition of halogen.

Oxygen may be added at the same time as halogen typified by chlorine.

Figure 1C:
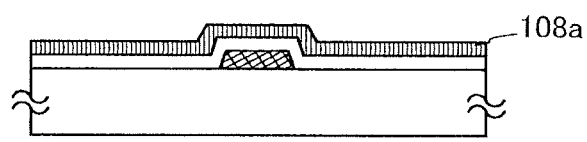

Next, a first oxide semiconductor film 108a with a thickness of greater than or equal to 2 nm and less than or equal to 15 nm is formed over the gate insulating layer 102 so as to overlap with the gate electrode layer 112 (see FIG. 1C). Note that the first oxide semiconductor film 108a is a film which is subjected to first heat treatment for crystallization after the deposition of an oxide semiconductor film and is crystallized.

In this embodiment, the first oxide semiconductor layer with a thickness of 5 nm is deposited in an oxygen atmosphere, an argon atmosphere, or a mixed atmosphere of argon and oxygen. The first oxide semiconductor layer is deposited with the use of an oxide semiconductor target (an In—Ga—Zn—O-based oxide semiconductor target ($In_2O_3$:$Ga_2O_3$:ZnO=1:1:2 [molar ratio])) and the distance between the substrate and the target is 170 mm, the pressure is 0.4 Pa, and the direct current (DC) power source is 0.5 kW. In this embodiment, since crystallization is intentionally caused by performing heat treatment in a later step, it is preferable to use an oxide semiconductor target in which crystallization is easily caused. Further, the first oxide semiconductor layer is deposited while the substrate to be processed is held in a deposition chamber kept under reduced pressure, and the substrate temperature is set to higher than or equal to 100° C. and lower than or equal to 600° C., preferably higher than or equal to 200° C. and lower than or equal to 500° C., more preferably higher than or equal to 300° C. and lower than or equal to 500° C. When the first heat treatment is performed for crystallization, the temperature is set to higher than or equal to 450° C. and lower than or equal to 850° C., preferably higher than or equal to 600° C. and lower than or equal to 700° C. Heating time is greater than or equal to 1 minute and less than or equal to 24 hours. Thus, the first oxide semiconductor film 108a having a crystal layer obtained by crystal growth from a surface by the first heat treatment is formed.

The crystal layer of the first oxide semiconductor film 108a is a plate-like crystal obtained by crystal growth from a surface to an inside. The crystal layer has an average thickness of greater than or equal to 2 nm and less than or equal to 10 nm. The crystal layer formed at the surface is c-axis aligned perpendicularly to the surface.

Note that in the first heat treatment, it is preferable that water, hydrogen, and the like be not contained in nitrogen, oxygen, or a rare gas such as helium, neon, or argon. It is preferable that the purity of nitrogen, oxygen, or a rare gas such as helium, neon, or argon introduced to the heat treatment apparatus be greater than or equal to 6N (99.9999%), more preferably greater than or equal to 7N (99.99999%) (that is, the impurity concentration is less than or equal to 1 ppm, more preferably less than or equal to 0.1 ppm). Further, the first heat treatment may be performed in a dry air atmosphere with an $H_2O$ concentration of less than or equal to 20 ppm.

Figure 1D:
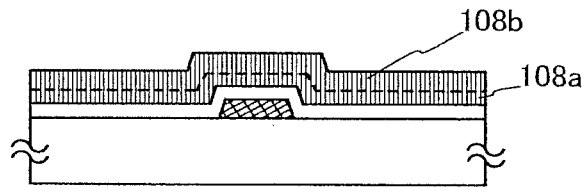

Next, a second oxide semiconductor film 108b whose thickness is at least greater than that of the first oxide semiconductor film 108a and less than or equal to 10 μm is formed over the first oxide semiconductor film 108a (see FIG. 1D). A second oxide semiconductor layer is deposited while the substrate to be processed is held in a deposition chamber kept under reduced pressure, and the substrate temperature is set to higher than or equal to 100° C. and lower than or equal to 600° C., preferably higher than or equal to 200° C. and lower than or equal to 500° C., more preferably higher than or equal to 300° C. and lower than or equal to 500° C. Note that the second oxide semiconductor film 108b is a film which is subjected to second heat treatment for crystallization after the deposition of an oxide semiconductor film and is crystallized. In the second heat treatment, crystal growth is caused with the use of the crystal layer of the first oxide semiconductor film 108a as a seed. The temperature of the second heat treatment is set to higher than or equal to 450° C. and lower than or equal to 850° C., preferably higher than or equal to 550° C. and lower than or equal to 650° C. Heating time is greater than or equal to 1 minute and less than or equal to 24 hours.

It is preferable that the first oxide semiconductor film 108a and the second oxide semiconductor film 108b be formed using materials containing the same components or have the same crystal structure and close lattice constants (a difference of lattice constants is less than or equal to 1%). In the case where the materials containing the same components are used; crystal growth can be easily caused with the use of the crystal layer of the first oxide semiconductor film 108a as a seed in crystallization performed later. In addition, in the case where the materials containing the same components are used, an interface property such as adhesion or electric characteristics is good.

In the stacked layer of the first oxide semiconductor film 108a and the second oxide semiconductor film 108b, a region overlapping with depressions and projections of the gate insulating layer has a grain boundary and therefore becomes a polycrystalline body. A region of the stacked layer of the oxide semiconductor films serving as a channel formation region has at least a flat surface and has a crystal structure in which the c-axis of the first oxide semiconductor film 108a and the c-axis of the second oxide semiconductor film 108b are aligned. In addition, in the stacked layer of the oxide semiconductor films, the a-axis and b-axis of crystals in the polycrystalline body in the channel formation region each are misaligned in some cases.

Figure 1E:
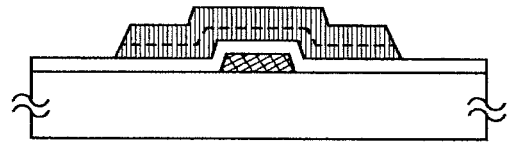

Next, the stacked layer of the first oxide semiconductor film 108a and the second oxide semiconductor film 108b is processed and an island-shaped oxide semiconductor film is formed (see FIG. 1E).

The stacked layer of the oxide semiconductor films can be processed by being etched after a mask having a desired shape is formed over the second oxide semiconductor film 108b. The mask can be formed by a method such as photolithography.

Next, treatment with oxygen (also referred to as oxygen doping treatment or oxygen plasma doping treatment) may be performed on the stacked layer of the oxide semiconductor films if needed. Note that it is preferable to apply an electrical bias to the substrate in order to perform oxygen doping more favorably. Further, heat treatment may be performed on the stacked layer of the oxide semiconductor films subjected to the oxygen doping treatment. The heat treatment temperature is higher than or equal to 250° C. and lower than or equal to 700° C., preferably higher than or equal to 400° C. and lower than or equal to 600° C., or lower than the strain point of the substrate. The oxygen doping treatment and the heat treatment may be repeated. By repeatedly performing the oxygen doping treatment and the heat treatment, the transistor can have higher reliability. Note that the number of repetitions can be set appropriately.

Figure 1F:
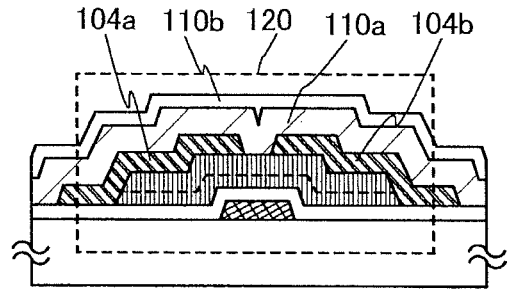

Next, a conductive film for forming a source electrode layer and a drain electrode layer (including a wiring formed in the same layer as the source electrode and the drain electrode) is formed over the gate insulating layer 102 and the stacked layer of the oxide semiconductor films and processed to form a source electrode layer 104a and a drain electrode layer 104b (see FIG. 1F). Note that the channel length L of the transistor is determined by the distance between the edges of the source electrode 104a and the drain electrode 104b which are formed here.

As the conductive film used for the source electrode layer 104a and the drain electrode layer 104b, a metal film containing an element selected from Al, Cr, Cu, Ta, Ti, Mo, and W, a metal nitride film containing any of the above elements as its component (e.g., a titanium nitride film, a molybdenum nitride film, or a tungsten nitride film), or the like may be used.

Alternatively, a conductive film may be used in which a high-melting-point metal film of Ti, Mo, W, or the like or a metal nitride film of any of these elements (a titanium nitride film, a molybdenum nitride film, or a tungsten nitride film) may be stacked on one of or both a bottom side and a top side of a metal film of Al, Cu, or the like.

An etching step may be performed with the use of a resist mask formed using a so-called multi-tone mask. A resist mask formed using a multi-tone mask has a plurality of thicknesses and can be further changed in shape by ashing; thus, such a resist mask can be used in a plurality of etching steps for different patterns. Therefore, a resist mask corresponding to at least two kinds of different patterns can be formed by using one multi-tone mask. In other words, simplification of the steps can be realized.

Next, an insulating film 110a in contact with part of the second oxide semiconductor film 108b and covering the source electrode layer 104a and the drain electrode layer 104b, and an insulating film 110b covering the source electrode layer 104a and the drain electrode layer 104b are formed (see FIG. 1F).

It is preferable to use an insulating material containing a component similar to that of the second oxide semiconductor film 108b for the insulating film 110a. Such a material is compatible with the oxide semiconductor film; thus, when it is used for the insulating film 110a, the state of the interface between the insulating film 110a and the second oxide semiconductor film 108b can be kept favorably. Here, "a component similar to that of the second oxide semiconductor film 108b" means one or more of elements selected from constituent metal elements of the second oxide semiconductor film 108b. For example, in the case where the second oxide semiconductor film 108b is formed using an In—Ga—Zn—O-based oxide semiconductor material, a gallium oxide or the like is given as such an insulating material containing a component similar to that of the second oxide semiconductor film 108b.

Further, the insulating film 110a preferably contains oxygen that exceeds the stoichiometric proportion, more preferably contains oxygen more than 1 time and less than two times the stoichiometric proportion. When the insulating film 110a thus contains excessive oxygen, oxygen is supplied to the second oxide semiconductor film 108b and the interface between the insulating film 110a and the second oxide semiconductor film 108b, so that oxygen deficiency can be reduced.

The insulating film 110b can be formed in a similar manner to the gate insulating layer 102. That is, the insulating film 110b can be formed to have a single-layer structure or a stacked-layer structure using a material such as silicon oxide, silicon nitride, silicon oxynitride, silicon nitride oxide, aluminum oxide, aluminum nitride, aluminum oxynitride, aluminum nitride oxide, or hafnium oxide, or a mixed material thereof.

The insulating film 110b preferably contains oxygen that exceeds the stoichiometric proportion, more preferably contains oxygen more than 1 time and less than two times the stoichiometric proportion. When the insulating film 110b thus contains excessive oxygen, oxygen is supplied to the second oxide semiconductor film 108b and the interface between the insulating film 110a and the second oxide semiconductor film 108b, so that oxygen deficiency can be reduced.

Through the above process, a transistor 120 is formed.

The transistor 120 shown in FIG. 1F includes the gate electrode layer 112, the gate insulating layer 102, the first oxide semiconductor film 108a, the second oxide semiconductor film 108b, the source electrode layer 104a, the drain electrode layer 104b, the insulating film 110a, and the insulating film 110b, which are formed over the substrate 100.

In the transistor 120 shown in FIG. 1F, halogen doping treatment is performed on the gate insulating layer 102. The c-axis of each of the first oxide semiconductor film 108a and the second oxide semiconductor film 108b are aligned perpendicularly to the surface of the crystal layer in the second oxide semiconductor film 108b at least part of which is crystallized. Consequently, the transistor 120 with higher reliability is realized.

In the transistor 120, the electronegativity of halogen such as chlorine or fluorine is larger than that of a metal (Zn, Ga, and In) in the stacked layer of the oxide semiconductor films, so that a hydrogen atom can be taken away from a M-H bond in the stacked layer of the oxide semiconductor films by containing halogen in the gate insulating layer 102. Thus, a hydrogen ion detached from the M-H bond in the stacked layer of the oxide semiconductor films which causes deterioration of the transistor 120 can be trapped by halogen such as chlorine or fluorine added at the interface between the stacked layer of the oxide semiconductor films and the gate insulating layer 102.

(Embodiment 2)

In this embodiment, an example of steps which are partially different from that described in Embodiment 1 will be described with reference to FIGS. 2A to 2F. Note that in FIGS. 2A to 2F, the same reference numerals are used for the same parts in FIGS. 1A to 1F.

First, a conductive film is formed over the substrate 100 having an insulating surface, and then the gate electrode layer 112 is formed through a photolithography step in a manner similar to that of Embodiment 1. The gate insulating layer 102 is formed over the gate electrode layer 112 (see FIG. 2A).

If necessary, halogen doping treatment may be performed after the gate insulating layer 102 is formed as in Embodiment 1. A halogen element may be contained in the gate insulating layer 102 at the time of the deposition. In that case, for example, a silicon oxide film containing fluorine is formed by a plasma CVD method with the use of tetrafluorosilane and oxygen and is used as the gate insulating layer 102. Alternatively, the gate insulating layer 102 may be formed after a deposition chamber is cleaned with the use of a fluoride gas such as $ClF_3$ or $NF_3$ so that fluorine or chlorine absorbed on inner walls of the deposition chamber may be intentionally contained in the gate insulating layer 102.

Figure 2A:
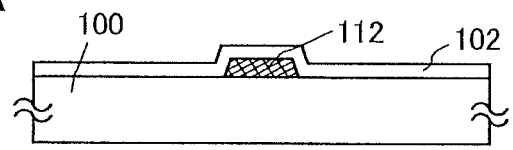
FIGS. 2A to 2F are cross-sectional views showing steps of one embodiment of the present invention.
Figure 2B:
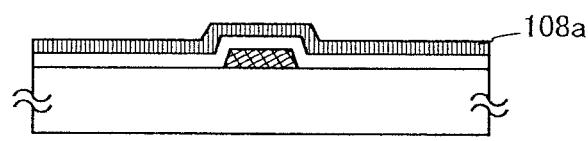

Next, the first oxide semiconductor film 108a with a thickness of greater than or equal to 2 nm and less than or equal to 15 nm or less is formed over the gate insulating layer 102 so as to overlap with the gate electrode layer 112 (see FIG. 2B). Note that the first oxide semiconductor film 108a is a film which is subjected to first heat treatment for crystallization after the deposition of the oxide semiconductor film and is crystallized as in Embodiment 1.

Figure 2C:
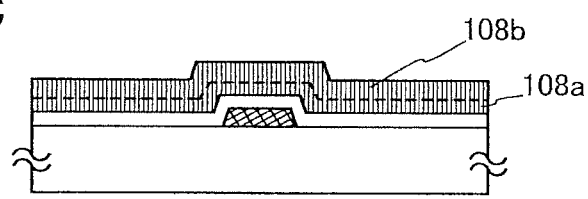

Next, the second oxide semiconductor film 108b whose thickness is at least greater than that of the first oxide semiconductor film 108a and less than or equal to 10 μm is formed over the first oxide semiconductor film 108a (see FIG. 2C). Note that the second oxide semiconductor film 108b is a film which is subjected to second heat treatment for crystallization after the deposition of the oxide semiconductor film and is crystallized as in Embodiment 1.

Figure 2D:
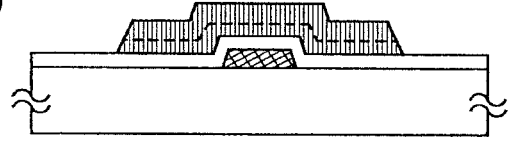

Then, a stacked layer of the first oxide semiconductor film 108a and the second oxide semiconductor film 108b is processed into an island-shaped oxide semiconductor film (see FIG. 2D).

The stacked layer of the oxide semiconductor films can be processed by etching after a mask having a desired shape is formed over the stacked layer of the oxide semiconductor films. The above mask can be formed by a method such as photolithography. Alternatively, a method such as an inkjet method may be used to form the mask.

For the etching of the stacked layer of the oxide semiconductor films, either wet etching or dry etching may be employed. It is needless to say that these may be combined.

Note that the stacked layer of the oxide semiconductor films is not necessarily processed to have island shape.

Figure 2E:
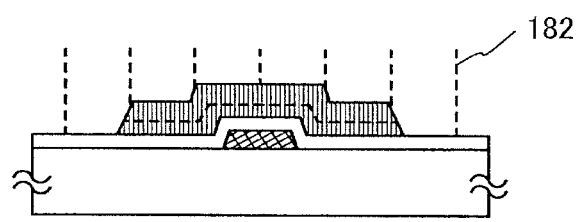

Next, the second oxide semiconductor film 108b is subjected to treatment with oxygen 182 (also referred to as oxygen doping treatment or oxygen plasma doping treatment) (see FIG. 2E). Here, at least any of an oxygen radical, an oxygen atom, and an oxygen ion is included in the oxygen 182. By performing oxygen doping treatment on the stacked layer of the oxide semiconductor films, the oxygen can be contained in the stacked layer of the oxide semiconductor films, in the vicinity of the interface of the stacked layer of the oxide semiconductor films, or in the stacked layer of the oxide semiconductor films and the vicinity of the interface of the stacked layer of the oxide semiconductor films. In this case, the oxygen content is higher than the stoichiometric proportion of the stacked layer of the oxide semiconductor films, preferably greater than the stoichiometric proportion and less than double of the stoichiometric proportion. Alternatively, the oxygen content may be greater than Y, preferably greater than Y and less than 2Y, where the oxygen amount in the case where the material of the stacked layer of the oxide semiconductor films is a single crystal is Y. Still alternatively, the oxygen content may be greater than Z, preferably greater than Z and less than 2Z based on the oxygen amount Z in the insulating film in the case where oxygen doping is not performed. The reason why the above preferable range has the upper limit is that the stacked layer of the oxide semiconductor films might absorb hydrogen like a hydrogen-storing alloy when the oxygen content is too high. The oxygen content is greater than the hydrogen content in the stacked layer of the oxide semiconductor films.

In the case of a material expressed by the chemical formula $InGaO_3(ZnO)_m$ (m>0), x in $InGaZnO_x$ can be greater than 4 and less than 8 when the crystalline structure where in is 1 ($InGaZnO_4$) is used as the reference, and x in $InGaZn_2O_x$ can be greater than 5 and less than 10 when the crystalline structure where m is 2 ($InGaZn_2O_5$) is used as the reference. Such an excessive oxygen region may exist in part of the stacked layer of the oxide semiconductor films (including the interface).

Oxygen is one of the main component materials of an oxide semiconductor film. Thus, it is difficult to accurately estimate the oxygen concentration of the oxide semiconductor film by a method such as secondary ion mass spectrometry (SIMS). In other words, it can be said that it is hard to determine whether oxygen is intentionally added to the oxide semiconductor film.

Isotopes such as $^{17}O$ and $^{18}O$ exist in oxygen, and it is know that the existence proportions of them in nature are about 0.037% and about 0.204% of all the oxygen atoms. That is to say, it is possible to measure the concentrations of these isotopes in the oxide semiconductor film by a method such as SIMS; therefore, the oxygen concentration of the oxide semiconductor film may be able to be estimated more accurately by measuring the concentrations of these isotopes. Thus, the concentrations of these isotopes may be measured to determine whether oxygen is intentionally added to the oxide semiconductor film.

For example, when the concentration of $^{18}O$ is used as the reference, D1 ($^{18}O$)>D2 ($^{18}O$) is satisfied where D1 ($^{18}O$) is the concentration of an isotope of oxygen in a region of the oxide semiconductor film to which oxygen has been added, and D2 ($^{18}O$) is the concentration of an isotope of oxygen in a region of the oxide semiconductor film to which oxygen is not added.

It is preferable that at least part of the oxygen 182 added to the stacked layer of the oxide semiconductor films have dangling bonds in the stacked layer of the oxide semiconductor films. This is because, with the dangling bond, the oxygen 182 can be bonded with hydrogen which can remain in the film, so that the hydrogen can be fixed (made to be an immovable ion).

The oxygen 182 can be generated by a plasma generating apparatus or an ozone generating apparatus. Specifically, for example, the oxygen 182 is generated using an apparatus capable of performing etching on a semiconductor device, an apparatus capable of performing ashing on a resist mask, or the like, and the stacked layer of the oxide semiconductor films can be processed. Alternatively, the oxygen may be added by performing irradiation with an oxygen ion accelerated by an electric field. A high-density plasma CVD method using microwaves (for example, a frequency of 2.45 GHz) may be employed to add the oxygen. In the case where a high-density plasma CVD method using microwaves is employed, the stacked layer of oxide semiconductor films is hardly damaged at the addition of the oxygen.

In order to add oxygen more preferably, it is preferable to apply an electrical bias to a substrate when treatment with oxygen is performed. For example, in the case where the oxygen is added using an ICP apparatus, high frequency power supply of greater than or equal to 1 kW and less than or equal to 10 kW may be applied to an ICP coil and a substrate bias of 1000 W may be applied to a substrate stage.

Note that heat treatment may be performed on the stacked layer of the oxide semiconductor films being subjected to the oxygen doping treatment. The heat treatment temperature is higher than or equal to 250° C. and lower than or equal to 700° C., preferably higher than or equal to 400° C. and lower than or equal to 600° C., or lower than the strain point of the substrate.

Through the heat treatment, water, a hydroxide (OH), and the like generated by reaction between oxygen and hydrogen contained in the material of the oxide semiconductor can be removed from the oxide semiconductor film. Hydrogen or the like entered the stacked layer of the oxide semiconductor films or the like due to the above oxygen doping treatment can also be removed by this heat treatment. The heat treatment may be performed in an atmosphere from which water, hydrogen, or the like is satisfactorily reduced, such as a nitrogen atmosphere, an oxygen atmosphere, an ultra-dry air atmosphere (the moisture amount is less than or equal to 20 ppm (−55° C. by conversion into a dew point), preferably less than or equal to 1 ppm, more preferably less than or equal to 10 ppb when measured with the use of a dew point meter of a cavity ring down laser spectroscopy (CRDS) system), or a rare gas atmosphere (such as argon and helium). In particular, the heat treatment is preferably performed in an atmosphere containing oxygen. Further, the purity of nitrogen, oxygen, or a rare gas introduced into a heat treatment apparatus is preferably higher than or equal to 6N (99.9999%) (that is, lower than or equal to the impurity concentration is 1 ppm), further preferably higher than or equal to 7N (99.99999%) (that is, lower than or equal to the impurity concentration is 0.1 ppm).

The oxygen doping treatment and the heat treatment may be repeated. By repeatedly performing the oxygen doping treatment and the heat treatment, the transistor can have higher reliability. Note that the number of repetitions can be set appropriately.

In the heat treatment according to this embodiment, the stacked layer of the oxide semiconductor films is desirably heated in an atmosphere containing oxygen. Thus, oxygen, which may be reduced due to the above crystallization treatment, can be supplied to the stacked layer of the oxide semiconductor films. In this sense, the heat treatment can also be referred to as supply of oxygen. The crystallization treatment is also referred to as dehydration treatment (or dehydrogenation treatment) by which impurities containing hydrogen in the oxide semiconductor (such as water and OH) are eliminated.

Note that there is no particular limitation on the timing of the heat treatment for supply of oxygen as long as it is after formation of the stacked layer of the oxide semiconductor films. For example, the heat treatment for supply of oxygen may be performed after the formation of the insulating film 110a described later. Alternatively, the heat treatment for supply of oxygen may be performed after the gate electrode layer is formed. The heat treatment for supply of oxygen may be performed following to heat treatment for dehydration or the like; heat treatment for dehydration or the like may also serve as the heat treatment supply of oxygen; the heat treatment for supply of oxygen may also serve as heat treatment for dehydration or the like.

As described above, when heat treatment for dehydration or the like and oxygen doping treatment or heat treatment for supplying oxygen are performed, the stacked layer of the oxide semiconductor films can be highly purified so as to contain impurities except main components of the stacked layer of oxide semiconductor films as little as possible. The stacked layer of the oxide semiconductor films which is highly purified contains extremely few (close to zero) carriers derived from a donor.

Note that in this embodiment, the heat treatment for crystallization or the like is performed, the stacked layer of the oxide semiconductor films is processed to have an island shape, the oxygen doping treatment is performed, and the heat treatment for supply of oxygen is performed; however, these steps are not limited to this order.

Figure 2F:
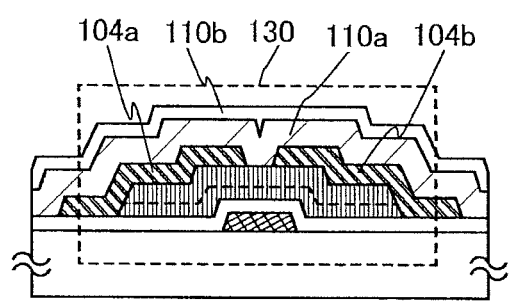

Next, a conductive film for forming a source electrode layer and a drain electrode layer (including a wiring formed in the same layer as the source electrode and the drain electrode) is formed over the gate insulating layer 102 and the stacked layer of the oxide semiconductor films and processed to form the source electrode layer 104a and the drain electrode layer 104b in a manner similar to that of Embodiment 1 (see FIG. 2F).

Next, the insulating film 110a being in contact with part of the second oxide semiconductor film 108b and covering the source electrode layer 104a and the drain electrode layer 104b, and the insulating film 110b covering the source electrode 104a and the drain electrode 104b are formed (see FIG. 2F).

Through the above process, a transistor 130 is formed. In the transistor 130, the stacked layer of the oxide semiconductor films is crystallized and the oxygen content of the oxide semiconductor film is increased; thus, deterioration due to electrical bias stress or heat stress can be suppressed and deterioration due to light can be reduced.

Note that the above description is an example of performing oxygen doping treatment on the stacked layer of the oxide semiconductor films which is processed to have an island shape; however, one embodiment of the disclosed invention is not limited to this. For example, the stacked layer of the oxide semiconductor films may be processed to have an island shape after crystallization treatment and oxygen doping treatment are performed, or oxygen doping treatment may be performed after formation of the source electrode layer 104a and the drain electrode layer 104b.

(Embodiment 3)

In this embodiment, cross-sectional views of a transistor 140 and a transistor 150 are described as modified examples of the transistor 120 and the transistor 130 shown in FIG. 1F and FIG. 2F respectively.

Figure 3A:
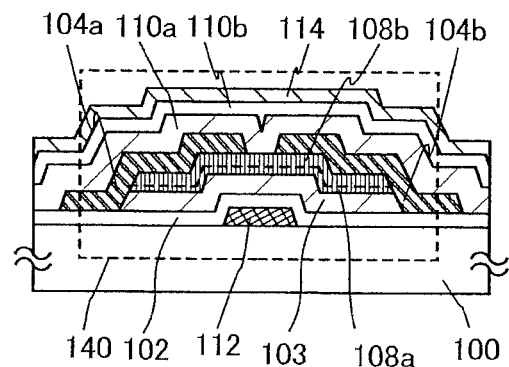
FIGS. 3A and 3B are cross-sectional views each showing one embodiment of the present invention.

The transistor 140 shown in FIG. 3A is the same as the transistor 120 in that it includes the gate electrode layer 112, the gate insulating layer 102, the first oxide semiconductor film 108a, the second oxide semiconductor film 108b, the source electrode layer 104a, the drain electrode layer 104b, the insulating film 110a, and the insulating film 110b, which are formed over the substrate 100. The difference between the transistor 140 and the transistor 120 is the presence of a second gate insulating layer 103 and an insulating film 114 covering the above components. In other words, the transistor 140 includes the second gate insulating layer 103 and the insulating film 114. The other components are the same as those of the transistor 120 in FIG. 1F; thus, the description of FIGS. 1A to 1F can be referred to for the details thereof.

It is particularly preferable to use an insulating material containing a component similar to that of the first oxide semiconductor film 108a for the second gate insulating layer 103. Such a material is compatible with the first oxide semiconductor film 108a; thus, when it is used for the second gate insulating layer 103, the state of the interface between the first oxide semiconductor film 108a and the second gate insulating layer 103 can be kept favorably. Here, "a component similar to that of the first oxide semiconductor film 108a" means one or more of elements selected from constituent metal elements of the first oxide semiconductor film 108a. In the case where the first oxide semiconductor film 108a is formed of an In—Ga—Zn-based oxide semiconductor material, gallium oxide or the like is given as the insulating material containing a component similar to that of the first oxide semiconductor film 108a, for example.

Note that the insulating film 114 can be formed using silicon oxide, silicon nitride, aluminum oxide, aluminum nitride, or gallium oxide; a mixed material thereof; or the like. In particular, a silicon nitride film is preferable as the insulating film 114 because added oxygen can be prevented from being released to the outside and entry of hydrogen and the like to the stacked layer of the oxide semiconductor films from the outside can be suppressed effectively. The hydrogen content of the insulating film 114 is less than or equal to $\frac{1}{10}$ of that of the nitrogen content thereof, and is preferably less than $1\times10^{20}$ cm$^{-3}$, more preferably less than $5\times10^{18}$ cm$^{-3}$. Note that a wiring connected to the source electrode layer 104a, the drain electrode layer 104b, the gate electrode layer 112, and the like may be faulted over the insulating film 114.

Figure 3B:
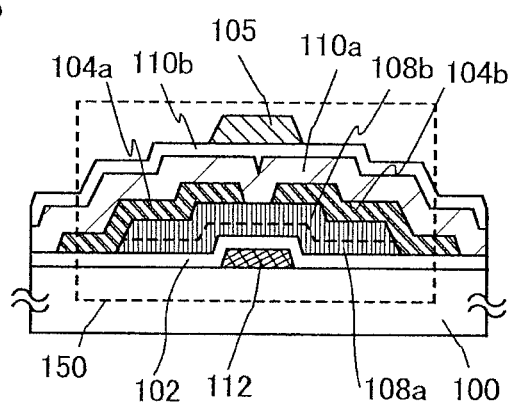

The transistor 150 shown in FIG. 3B is the same as the transistor 120 in that it includes the gate electrode layer 112, the gate insulating layer 102, the first oxide semiconductor film 108a, the second oxide semiconductor film 108b, the source electrode layer 104a, the drain electrode layer 104b, the insulating film 110a, and the insulating film 110b, which are formed over the substrate 100. The difference between the transistor 150 and the transistor 120 is the presence of a second gate electrode layer 105. That is, the transistor 150 includes the second gate electrode layer 105. The other components are the same as those of the transistor 120 in FIG. 1F; thus, the description of FIGS. 1A to 1F can be referred to for the details thereof.

Note that the second gate electrode layer 105 is an electrode layer which can function as a back gate. The potential of the back gate can be a fixed potential, e.g., 0 V, or a ground potential, and may be determined as appropriate by practitioners. In addition, by providing the gate electrode layers above and below the stacked layer of the semiconductor films in the transistor 150, the amount of shift in threshold voltage of the transistor can be reduced in a BT test for examining the reliability of the transistor. That is, by providing the gate electrodes above and below the stacked layer of the oxide semiconductor films, the reliability can improve. Further, by controlling gate voltage applied to the back gate, the threshold voltage can be controlled. Furthermore, when a light-blocking conductive film is used for the second gate electrode layer 105, the second gate electrode 105 can function as a light-blocking film of the stacked layer of the oxide semiconductor films, so that the reliability can be improved.

This embodiment can be freely combined with Embodiment 1 or 2.

(Embodiment 4)

A semiconductor device having a display function (also referred to as a display device) can be manufactured using the transistor exemplified in any of Embodiments 1 to 3. Moreover, some or all of driver circuits which include the transistor can be formed over a substrate where a pixel portion is formed, whereby a system-on-panel can be obtained.

Figure 4A:
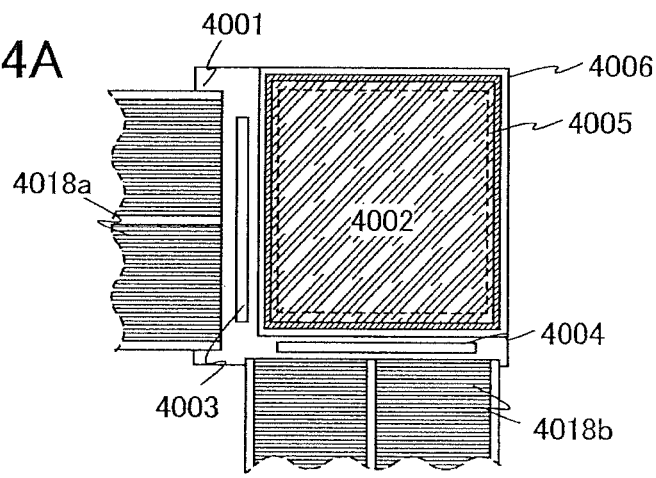
FIGS. 4A to 4C are diagrams each showing one embodiment of a semiconductor device.

In FIG. 4A, a sealant 4005 is provided so as to surround a pixel portion 4002 provided over a first substrate 4001, and the pixel portion 4002 is sealed between the first substrate 4001 and a second substrate 4006. In FIG. 4A, a signal line driver circuit 4003 and a scan line driver circuit 4004 which are formed using a single crystal semiconductor film or a polycrystalline semiconductor film over a substrate separately prepared are mounted in a region that is different from the region surrounded by the sealant 4005 over the first substrate 4001. Various signals and potential are supplied to the signal line driver circuit 4003 and the scan line driver circuit 4004 each of which is separately formed, and the pixel portion 4002 from flexible printed circuits (FPCs) 4018a and 4018b.

Figure 4B:
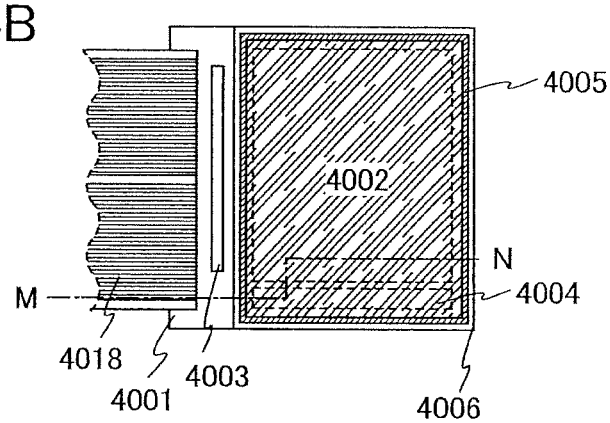
Figure 4C:
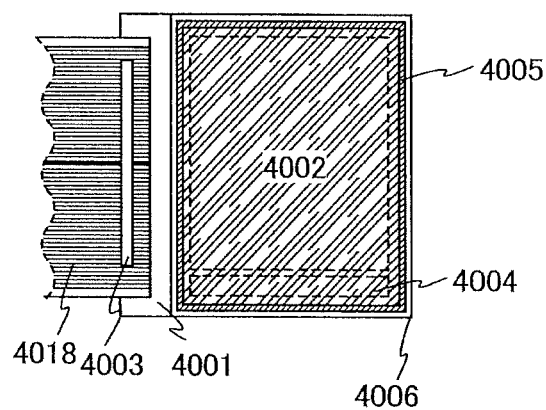

In FIGS. 4B and 4C, the sealant 4005 is provided so as to surround the pixel portion 4002 and the scan line driver circuit 4004 which are provided over the first substrate 4001. The second substrate 4006 is provided over the pixel portion 4002 and the scan line driver circuit 4004. Consequently, the pixel portion 4002 and the scan line driver circuit 4004 are sealed together with a display element, by the first substrate 4001, the sealant 4005, and the second substrate 4006. In FIGS. 4B and 4C, the signal line driver circuit 4003 which is formed using a single crystal semiconductor film or a polycrystalline semiconductor film over a substrate prepared separately is mounted in a region that is different from the region surrounded by the sealant 4005 over the first substrate 4001. In FIGS. 4B and 4C, a variety of signals and potentials are supplied to the signal line driver circuit 4003 which is separately formed, and the scan line driver circuit 4004 or the pixel portion 4002 from an FPC 4018.

Although FIGS. 4B and 4C each illustrate an example in which the signal line driver circuit 4003 is formed separately and mounted on the first substrate 4001, the present invention is not limited to this structure. The scan line driver circuit may be separately formed and then mounted, or only part of the signal line driver circuit or part of the scan line driver circuit may be separately formed and then mounted.

Note that a connection method of a separately formed driver circuit is not particularly limited, and a chip on glass (COG) method, a wire bonding method, a tape automated bonding (TAB) method or the like can be used. FIG. 4A shows an example in which the signal line driver circuit 4003 and the scan line driver circuit 4004 are mounted by a COG method. FIG. 4B shows an example in which the signal line driver circuit 4003 is mounted by a COG method. FIG. 4C shows an example in which the signal line driver circuit 4003 is mounted by a TAB method.

In addition, the display device includes a panel in which the display element is sealed, and a module in which an IC or the like including a controller is mounted on the panel.

Note that a display device in this specification means an image display device, a display device, or a light source (including a lighting device). Furthermore, the display device also includes the following modules in its category: a module to which a connector such as an FPC, a TAB tape, or a TCP is attached; a module having a TAB tape or a TCP at the tip of which a printed wiring board is provided; and a module in which an integrated circuit (IC) is directly mounted on a display element by a COG method.

The pixel portion and the scan line driver circuit provided over the first substrate include a plurality of transistors; any of the transistors which are described in Embodiments 1 to 3 can be applied thereto.

A liquid crystal element (also referred to as a liquid crystal display element) or a light-emitting element (also referred to as a light-emitting display element) can be used as the display element provided in the display device. The light-emitting element includes, in its category, an element whose luminance is controlled by a current or a voltage, and specifically includes, in its category, an inorganic electroluminescent (EL) element, an organic EL element, and the like. Furthermore, a display medium whose contrast is changed by an electric effect, such as electronic ink, can be used.

Figure 5:
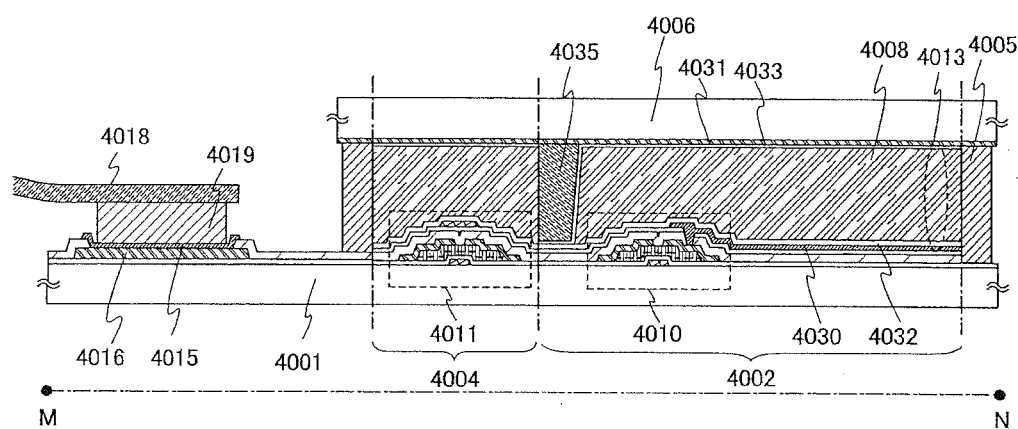
FIG. 5 is a diagram showing one embodiment of a semiconductor device.
Figure 6:
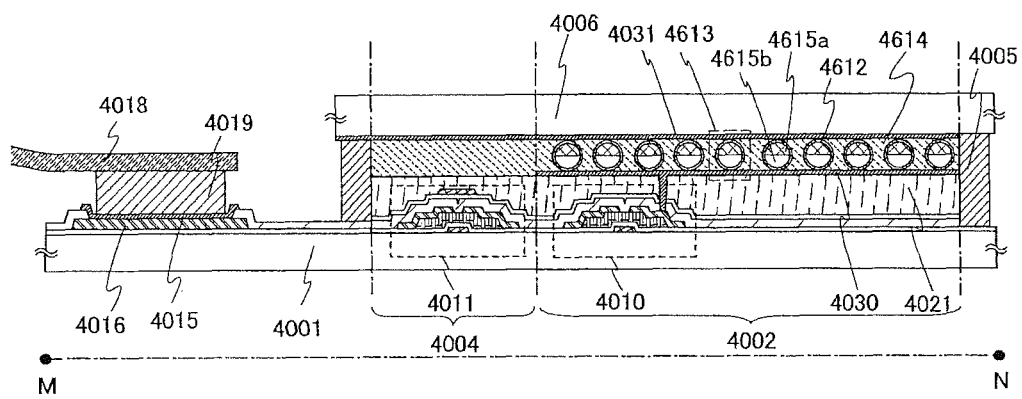
FIG. 6 is a diagram showing one embodiment of a semiconductor device.

Embodiments of the semiconductor device will be described with reference to FIG. 5 and FIG. 6. FIG. 5 and FIG. 6 correspond to cross-sectional views along line M-N in FIG. 4B.

As shown in FIG. 5 and FIG. 6, the semiconductor device includes a connection terminal electrode 4015 and a terminal electrode 4016, and the connection terminal electrode 4015 and the terminal electrode 4016 are electrically connected to a terminal included in the FPC 4018 through an anisotropic conductive film 4019.

The connection terminal electrode 4015 is formed using the same conductive film as a first electrode layer 4030, and the terminal electrode 4016 is formed using the same conductive film as source and drain electrode layers of a transistor 4010 and a transistor 4011.

The pixel portion 4002 and the scan line driver circuit 4004 provided over the first substrate 4001 include a plurality of transistors. FIG. 5 and FIG. 6 each illustrate the transistor 4010 included in the pixel portion 4002 and the transistor 4011 included in the scan line driver circuit 4004, as an example. In FIG. 6, an insulating layer 4021 is provided over the transistors 4010 and 4011.

In this embodiment, the transistors described in any one of Embodiments 1 to 3 can be applied to the transistor 4010 and the transistor 4011. Variation in electrical characteristics of the transistor 4010 and the transistor 4011 is suppressed and the transistor 4010 and the transistor 4011 are electrically stable. Consequently, semiconductor devices with high reliability can be provided as the semiconductor devices of this embodiment shown in FIG. 5 and FIG. 6.

In addition, in this embodiment, a conductive layer may be provided in a region over an insulating layer overlapping with a channel formation region of the oxide semiconductor film in the transistor 4011 for the driver circuit. By providing the conductive layer so as to overlap with the channel formation region of the oxide semiconductor film, the amount of change in the threshold voltage of the transistor 4011 by the BT test can be further reduced. The potential of the conductive layer may be the same as or different from that of a gate electrode layer of the transistor 4011, and the conductive layer can be functioned as a second gate electrode layer. The potential of the conductive layer may be GND, 0V, or in a floating state.

The conductive layer also functions to block an external electric field, that is, to prevent an external electric field (particularly, to prevent static electricity) from effecting the inside (a circuit portion including a transistor). A blocking function of the conductive layer can prevent the variation in electrical characteristics of the transistor due to the effect of external electric field such as static electricity.

The transistor 4010 included in the pixel portion 4002 is electrically connected to a display element to form a display panel. There is no particular limitation on the kind of the display element as long as display can be performed, and various kinds of display elements can be employed.

An example of a liquid crystal display device using a liquid crystal element as a display element is illustrated in FIG. 5. In FIG. 5, a liquid crystal element 4013 which is a display element includes the first electrode layer 4030, a second electrode layer 4031, and a liquid crystal layer 4008. Insulating films 4032 and 4033 serving as alignment films are provided so that the liquid crystal layer 4008 is interposed therebetween. The second electrode layer 4031 is provided on the second substrate 4006 side, and the first electrode layer 4030 and the second electrode layer 4031 are stacked, with the liquid crystal layer 4008 interposed therebetween.

A columnar spacer denoted by reference numeral 4035 is obtained by selective etching of an insulating film and is provided in order to control the thickness (a cell gap) of the liquid crystal layer 4008. Note that the spacer 4035 is not limited to a columnar spacer, and, for example, a spherical spacer may be used.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on a condition.

Alternatively, liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which 5 wt. % or more of a chiral material is mixed is used for the liquid crystal layer in order to improve the temperature range. The liquid crystal composition which includes a liquid crystal showing a blue phase and a chiral material has a short response time of 1 msec or less, has optical isotropy, which makes the alignment process unneeded, and has a small viewing angle dependence. In addition, since an alignment film does not need to be provided and rubbing treatment is unnecessary, electrostatic discharge damage caused by the rubbing treatment can be prevented and defects and damage of the liquid crystal display device can be reduced in the manufacturing process. Thus, productivity of the liquid crystal display device can be increased.

The specific resistivity of the liquid crystal material is $1\times10^9$ Ω·cm or more, preferably $1\times10^{11}$ Ω·cm or more, more preferably $1\times10^{12}$ Ω·cm or more. The value of the specific resistivity in this specification is measured at 20° C.

The size of storage capacitor formed in the liquid crystal display device is set considering the leakage current of the transistor provided in the pixel portion or the like so that charge can be held for a predetermined period. By using the transistor including the highly purified oxide semiconductor film, it is enough to provide a storage capacitor having a capacitance that is ⅓ or less, preferably ⅕ or less of a liquid crystal capacitance of each pixel.

Further, the current value in an off state (off state current value) of the transistor used in this embodiment can be made small. Therefore, an electrical signal such as an image signal can be held for a longer period in the pixel, and a writing interval can be set longer in an on state. Consequently, frequency of refresh operation can be reduced, which leads to an effect of suppressing power consumption.

In addition, the transistor used in this embodiment can have relatively high field-effect mobility and thus is capable of high speed operation. Therefore, by using the transistor in a pixel portion of a liquid crystal display device, a high-quality image can be provided. A driver circuit portion and a pixel portion each of which include the transistor can be formed over one substrate; thus, the number of components of the semiconductor device can be reduced.

For the liquid crystal display device, a twisted nematic (TN) mode, an in-plane-switching (IPS) mode, a fringe field switching (FFS) mode, an axially symmetric aligned microcell (ASM) mode, an optical compensated birefringence (OCB) mode, a ferroelectric liquid crystal (FLC) mode, an antiferroelectric liquid crystal (AFLC) mode, or the like can be used.

A normally black liquid crystal display device such as a transmissive liquid crystal display device utilizing a vertical alignment (VA) mode is preferable. Here, the vertical alignment mode is a method of controlling alignment of liquid crystal molecules of a liquid crystal display panel, in which liquid crystal molecules are aligned vertically to a panel surface when no voltage is applied. Some examples are given as the vertical alignment mode. For example, a multi-domain vertical alignment (MVA) mode, a patterned vertical alignment (PVA) mode, an ASV mode, and the like can be used. Moreover, it is possible to use a method called domain multiplication or multi-domain design, in which a pixel is divided into some regions (subpixels) and molecules are aligned in different directions in their respective regions.

In the display device, a black matrix (a light-blocking layer), an optical member (an optical substrate) such as a polarizing member, a retardation member, or an anti-reflection member, and the like are provided as appropriate. For example, circular polarization may be obtained by using a polarizing substrate and a retardation substrate. In addition, a backlight, a side light, or the like may be used as a light source.

In addition, it is possible to employ a time-division display method (also called a field-sequential driving method) with the use of a plurality of light-emitting diodes (LEDs) as a backlight. By employing a field-sequential driving method, color display can be performed without using a color filter.

As a display method in the pixel portion, a progressive method, an interlace method or the like can be employed. Further, color elements controlled in a pixel at the time of color display are not limited to three colors: R, G, and B (R, G, and B correspond to red, green, and blue respectively). For example, R, G, B, and W (W corresponds to white); R, G, B, and one or more of yellow, cyan, magenta, and the like; or the like can be used. Further, the sizes of display regions may be different between respective dots of color elements.

Alternatively, as the display element included in the display device, a light-emitting element utilizing electroluminescence can be used. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to a light-emitting element, electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

In order to extract light emitted from the light-emitting element, it is acceptable as long as at least one of a pair of electrodes is transparent. The light-emitting element can have a top emission structure in which light emission is extracted through the surface opposite to the substrate; a bottom emission structure in which light emission is extracted through the surface on the substrate side; or a dual emission structure in which light emission is extracted through the surface opposite to the substrate and the surface on the substrate side, and a light-emitting element having any of these emission structures can be used.

Further, an electronic paper in which electronic ink is driven can be provided as the display device. The electronic paper is also called an electrophoretic display device (electrophoretic display) and has advantages in that it has the same level of readability as regular paper, it has less power consumption than other display devices, and it can be set to have a thin and light form.

An electrophoretic display device can have various modes. An electrophoretic display device contains a plurality of microcapsules dispersed in a solvent or a solute, each microcapsule containing first particles which are positively charged and second particles which are negatively charged. By applying an electric field to the microcapsules, the particles in the microcapsules move in opposite directions to each other and only the color of the particles gathering on one side is displayed. Note that the first particles or the second particles contain pigment and do not move without an electric field. Moreover, the first particles and the second particles have different colors (which may be colorless).

Thus, an electrophoretic display device is a display device that utilizes a so-called dielectrophoretic effect by which a substance having a high dielectric constant moves to a high-electric field region.

A solution in which the above microcapsules are dispersed in a solvent is referred to as electronic ink. This electronic ink can be printed on a surface of glass, plastic, cloth, paper, or the like. Furthermore, by using a color filter or particles that have a pigment, color display can also be achieved.

Note that the first particles and the second particles in the microcapsules may each be formed of a single material selected from a conductive material, an insulating material, a semiconductor material, a magnetic material, a liquid crystal material, a ferroelectric material, an electroluminescent material, an electrochromic material, and a magnetophoretic material, or formed of a composite material of any of these.

As the electronic paper, a display device using a twisting ball display system can be used. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

FIG. 6 shows active matrix electronic paper as one embodiment of a semiconductor device. The electronic paper in FIG. 6 is an example of a display device using a twisting ball display system.

Between the first electrode layer 4030 connected to the transistor 4010 and the second electrode layer 4031 provided on the second substrate 4006, spherical particles 4613 each of which includes a black region 4615a, a white region 4615b, and a cavity 4612 which is filled with liquid around the black region 4615a and the white region 4615b, are provided. A space around the spherical particles 4613 is filled with a filler 4614 such as a resin. The second electrode layer 4031 corresponds to a common electrode (counter electrode). The second electrode layer 4031 is electrically connected to a common potential line.

In FIG. 5 and FIG. 6, as the first substrate 4001 and the second substrate 4006, flexible substrates, for example, plastic substrates having a light-transmitting property or the like can be used, in addition to glass substrates. As plastic, a fiberglass-reinforced plastics (FRP) plate, a polyvinyl fluoride (PVF) film, a polyester film, or an acrylic resin film can be used. In addition, a sheet with a structure in which an aluminum foil is sandwiched between PVF films or polyester films can be used.

The insulating layer 4021 can be formed using an inorganic insulating material or an organic insulating material. Note that the insulating layer 4021 formed using a heat-resistant organic insulating material such as an acrylic resin, polyimide, a benzocyclobutene-based resin, polyamide, or an epoxy resin is preferably used as a planarizing insulating film. Other than such organic insulating materials, it is possible to use a low-dielectric constant material (a low-k material), a siloxane based resin, phosphosilicate glass (PSG), borophosphosilicate glass (BPSG), or the like. The insulating layer may be formed by stacking a plurality of insulating films formed of these materials.

There is no particular limitation on the method for forming the insulating layer 4021, and the insulating layer 4021 can be formed, depending on the material, by a sputtering method, a spin coating method, a dipping method, spray coating, a droplet discharge method (e.g., an inkjet method, screen printing, or offset printing), or the like.

The display device displays images by transmitting light from a light source or a display element. Therefore, the substrate and the thin films such as the insulating film and the conductive film provided for the pixel portion where light is transmitted have light-transmitting properties with respect to light in the visible-light wavelength range.

The first electrode layer 4030 and the second electrode layer 4031 (each of which may be called a pixel electrode layer, a common electrode layer, a counter electrode layer, or the like) for applying voltage to the display element may have light-transmitting properties or light-reflecting properties, which depends on the direction in which light is extracted, the position where the electrode layer is provided, the pattern structure of the electrode layer, and the like.

The first electrode layer 4030 and the second electrode layer 4031 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

The first electrode layer 4030 and the second electrode layer 4031 can be formed of one or more kinds of materials selected from metals such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), and silver (Ag); alloys of these metals; and nitrides of these metals.

Since the transistor is easily broken owing to static electricity or the like, a protective circuit for protecting the driver circuit is preferably provided. The protective circuit is preferably formed using a nonlinear element.

As described above, by using the transistors exemplified in any one of Embodiments 1 to 3, a highly reliable semiconductor device can be provided.

This embodiment can be implemented in appropriate combination with the structures described in the other embodiments.

(Embodiment 5)

A semiconductor device disclosed in this specification can be applied to a variety of electronic appliances (including game machines). Examples of electronic appliances are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game machine, a personal digital assistant, an audio reproducing device, a large-sized game machine such as a pachinko machine, and the like. Examples of electronic appliances each including the display device described in any of the above embodiments will be described.

Figure 7A:
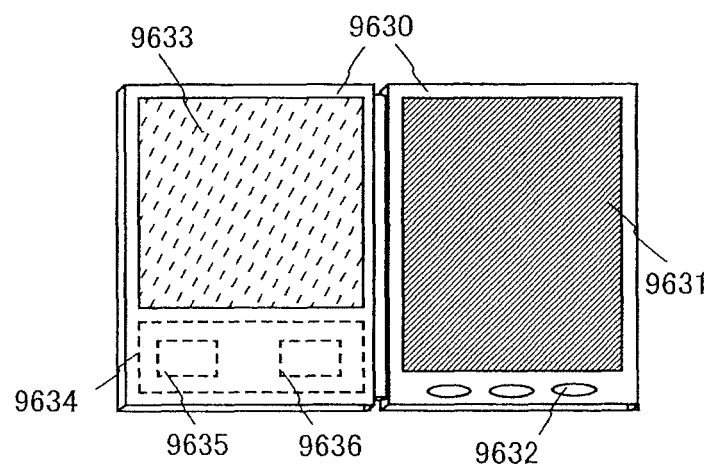
FIGS. 7A and 7B are diagrams showing an electronic appliance.

FIG. 7A shows an electronic book reader (also referred to as an e-book reader) which can include housings 9630, a display portion 9631, operation keys 9632, a solar battery 9633, and a charge and discharge control circuit 9634. The electronic book reader shown in FIG. 7A has a function of displaying various kinds of data (e.g., a still image, a moving image, and a text image) on the display portion, a function of displaying a calendar, a date, the time, or the like on the display portion, a function of operating or editing the data displayed on the display portion, a function of controlling processing by various kinds of software (programs), and the like. Note that in FIG. 7A, the charge and discharge control circuit 9634 has a battery 9635 and a DCDC converter (hereinafter abbreviated as a converter) 9636 as an example. The semiconductor device described in Embodiment 4 can be applied to the display portion 9631, whereby a highly reliable electronic book reader can be provided.

In the case of using a transflective or reflective liquid crystal display device as the display portion 9631 in the structure shown in FIG. 7A, the electronic book reader may be used in a comparatively bright environment. In that case, power generation by the solar battery 9633 and charge by the battery 9635 can be effectively performed, which is preferable. Since the solar battery 9633 can be provided on a space (a surface or a rear surface) of the housings 9630 as appropriate, the battery 9635 can be efficiently charged, which is preferable. When a lithium ion battery is used as the battery 9635, there is an advantage of downsizing or the like.

Figure 7B:
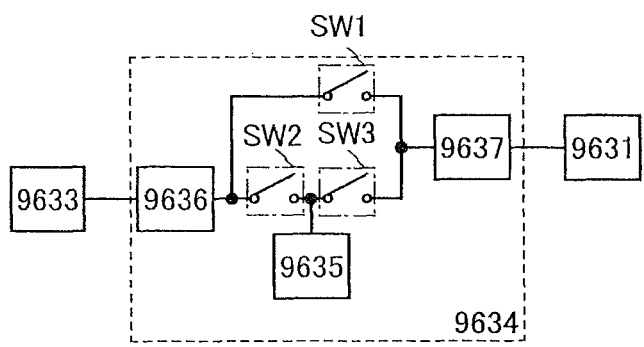

The structure and the operation of the charge and discharge control circuit 9634 shown in FIG. 7A are described with reference to a block diagram in FIG. 7B. The solar battery 9633, the battery 9635, the converter 9636, a converter 9637, switches SW1 to SW3, and the display portion 9631 are shown in FIG. 7B, and the battery 9635, the converter 9636, the converter 9637, and the switches SW1 to SW3 correspond to the charge and discharge control circuit 9634.

First, an example of operation in the case where power is generated by the solar battery 9633 using external light is described. The voltage of power generated by the solar battery 9633 is raised or lowered by the converter 9636 so that the power has a voltage for charging the battery 9635. When the power from the solar battery 9633 is used for the operation of the display portion 9631, the switch SW1 is turned on and the voltage of the power is raised or lowered by the converter 9637 so as to be a voltage needed for the display portion 9631. In addition, when display on the display portion 9631 is not performed, the switch SW1 is turned off and the switch SW2 is turned on so that the battery 9635 may be charged.

Next, operation in the case where power is not generated by the solar battery 9633 using external light is described. The voltage of power accumulated in the battery 9635 is raised or lowered by the converter 9637 by turning on the switch SW3. Then, power from the battery 9635 is used for the operation of the display portion 9631.

Note that although the solar battery 9633 is described as an example of a means for charge, the battery 9635 may be charged by another means. In addition, a combination of the solar battery 9633 and another means for charge may be used.

Figure 8A:
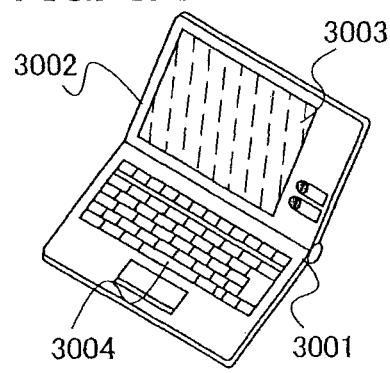
FIGS. 8A to 8F are diagrams each showing an electronic appliance.

FIG. 8A shows a laptop personal computer, which includes a main body 3001, a housing 3002, a display portion 3003, a keyboard 3004, and the like. The semiconductor device described in Embodiment 4 is applied to the display portion 3003, whereby a highly reliable laptop personal computer can be provided.

Figure 8B:
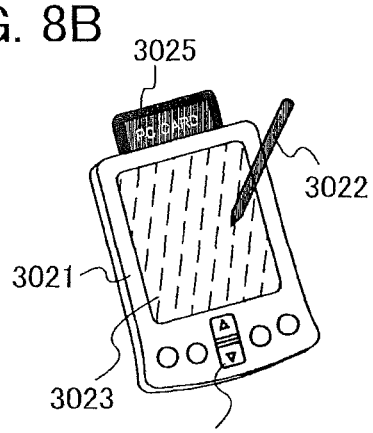

FIG. 8B is a personal digital assistant (PDA) including a display portion 3023, an external interface 3025, an operation button 3024, and the like in a main body 3021. A stylus 3022 is included as an accessory for operation. The semiconductor device described in Embodiment 4 is applied to the display portion 3023, whereby a highly reliable personal digital assistant (PDA) can be provided.

Figure 8C:
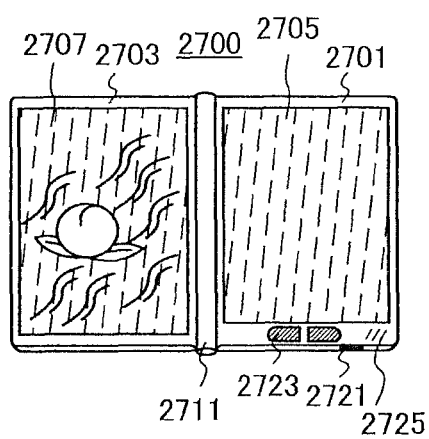

FIG. 8C is an example of an e-book reader. For example, the e-book reader 2700 includes two housings, a housing 2701 and a housing 2703. The housing 2701 and the housing 2703 are combined with a hinge 2711 so that the e-book reader 2700 can be opened and closed with the hinge 2711 as an axis. With such a structure, the e-book reader 2700 can operate like a paper book.

A display portion 2705 and a display portion 2707 are incorporated in the housing 2701 and the housing 2703 respectively. The display portion 2705 and the display portion 2707 may display one image or different images. In the structure where different images are displayed in different display portions, for example, the right display portion (the display portion 2705 in FIG. 8C) can display text and the left display portion (the display portion 2707 in FIG. 8C) can display images. When the semiconductor device shown in Embodiment 4 is applied to the display portions 2705 and 2707, the e-book reader 2700 with high reliability can be obtained.

FIG. 8C shows an example in which the housing 2701 is provided with an operation portion and the like. For example, the housing 2701 is provided with a power switch 2721, operation keys 2723, a speaker 2725, and the like. With the operation keys 2723, pages can be turned. Note that a keyboard, a pointing device, or the like may also be provided on the surface of the housing, on which the display portion is provided. Furthermore, an external connection terminal (an earphone terminal, a USB terminal, or the like), a recording medium insertion portion, and the like may be provided on the back surface or the side surface of the housing. Moreover, the e-book reader 2700 may have a function of an electronic dictionary.

The e-book reader 2700 may have a structure capable of wirelessly transmitting and receiving data. Through wireless communication, desired book data or the like can be purchased and downloaded from an electronic book server.

Figure 8D:
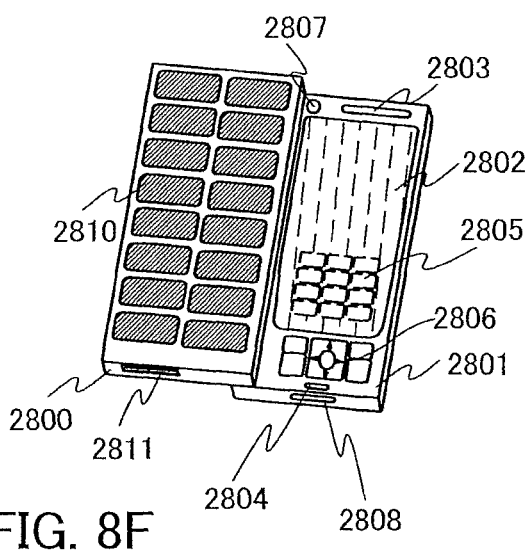

FIG. 8D is a mobile phone, which includes two housings, a housing 2800 and a housing 2801. The housing 2801 includes a display panel 2802, a speaker 2803, a microphone 2804, a pointing device 2806, a camera lens 2807, an external connection terminal 2808, and the like. In addition, the housing 2800 includes a solar cell 2810 having a function of charge of the mobile phone, an external memory slot 2811, and the like. Further, an antenna is incorporated in the housing 2801. The semiconductor device described in Embodiment 4 is applied to the display panel 2802, whereby a highly reliable mobile phone can be provided.

The display panel 2802 is provided with a touch panel. A plurality of operation keys 2805 which is displayed as images is illustrated by dashed lines in FIG. 8D. Note that a boosting circuit by which a voltage output from the solar cell 2810 is increased to be sufficiently high for each circuit is also included.

The display direction of the display panel 2802 can be appropriately changed depending on a usage pattern. Further, the display device is provided with the camera lens 2807 on the same surface as the display panel 2802, and thus it can be used as a video phone. The speaker 2803 and the microphone 2804 can be used for videophone calls, recording and playing sound, and the like as well as voice calls. Moreover, the housing 2800 and the housing 2801 developed as shown in FIG. 8D can be slid so that one is lapped over the other; thus, the size of the mobile phone can be reduced, which makes the mobile phone suitable for being carried.

The external connection terminal 2808 can be connected to an AC adapter and various types of cables such as a USB cable, and charging and data communication with a personal computer are possible. Moreover, a large amount of data can be stored by inserting a storage medium into the external memory slot 2811 and can be moved.

Further, in addition to the above functions, an infrared communication function, a television reception function, or the like may be provided.

Figure 8E:
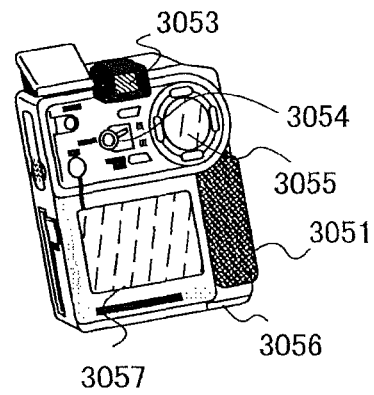

FIG. 8E is a digital video camera which includes a main body 3051, a display portion A 3057, an eyepiece 3053, an operation switch 3054, a display portion B 3055, a battery 3056, and the like. The semiconductor device described in Embodiment 4 is applied to the display portion A 3057 and the display portion B 3055, whereby a highly reliable digital video camera can be provided.

Figure 8F:
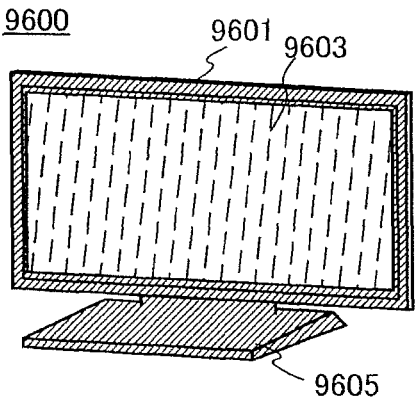

FIG. 8F is an example of a television device. In a television set 9600, a display portion 9603 is incorporated in a housing 9601. The display portion 9603 can display images. Here, the housing 9601 is supported by a stand 9605. When the semiconductor device shown in Embodiment 4 is applied to the display portion 9603, the television set 9600 with high reliability can be obtained.

The television set 9600 can be operated by an operation switch of the housing 9601 or a separate remote controller. Further, the remote controller may be provided with a display portion for displaying data which is output from the remote controller.

Note that the television set 9600 is provided with a receiver, a modem, and the like. With the use of the receiver, general television broadcasting can be received. Moreover, when the display device is connected to a communication network with or without wires via the modem, one-way (from a sender to a receiver) or two-way (between a sender and a receiver or between receivers) information communication can be performed.

The structures and methods described in this embodiment can be combined as appropriate with any of the structures and methods described in the other embodiments.

This application is based on Japanese Patent Application serial no. 2010-117020 filed with Japan Patent Office on May 21, 2010, the entire contents of which are hereby incorporated by reference.

What is claimed is:

1. A method for manufacturing a semiconductor device, the method comprising the steps of:
    forming an insulating layer over a substrate;
    performing a plasma treatment on the insulating layer;
    forming a stacked oxide semiconductor film over the insulating layer, the stacked oxide semiconductor film comprising a first oxide semiconductor film and a second oxide semiconductor film over the first oxide semiconductor film; and
    forming an oxide film comprising gallium oxide over the stacked oxide semiconductor film,
    wherein the first oxide semiconductor film includes crystals which are c-axis aligned,
    wherein the second oxide semiconductor film includes crystals which are c-axis aligned, and
    wherein the oxide film includes one or more elements selected from constituent metal element of the second oxide semiconductor film.

2. The method for manufacturing a semiconductor device according to claim 1, the method further comprising the step of forming an electrode over the oxide film,
    wherein the electrode overlaps with the first oxide semiconductor film and the second oxide semiconductor film.

3. The method for manufacturing a semiconductor device according to claim 1, the method further comprising the step of forming a gate electrode before forming the insulating layer.

4. The method for manufacturing a semiconductor device according to claim 1, wherein oxygen is added to the insulating layer by the plasma treatment.

5. The method for manufacturing a semiconductor device according to claim 1, wherein halogen is added to the insulating layer by the plasma treatment.

6. The method for manufacturing a semiconductor device according to claim 1, wherein the plasma treatment is performed using a high-density plasma CVD apparatus.

7. The method for manufacturing a semiconductor device according to claim 1,
wherein each of the first oxide semiconductor film and the second oxide semiconductor film contains indium, gallium and zinc.

8. The method for manufacturing a semiconductor device according to claim 1,
wherein the crystals in the first oxide semiconductor film are c-axis aligned perpendicularly to a surface of the first oxide semiconductor film, and
wherein the crystals in the second oxide semiconductor film are c-axis aligned perpendicularly to a surface of the second oxide semiconductor film.

9. The method for manufacturing a semiconductor device according to claim 1, further comprising the step of performing a plasma treatment on the stacked oxide semiconductor film whereby oxygen is added to the stacked oxide semiconductor film.

10. A method for manufacturing a semiconductor device, the method comprising the steps of:
forming a gate electrode over a substrate;
forming a gate insulating layer over the gate electrode;
forming a stacked oxide semiconductor film over the gate insulating layer, the stacked oxide semiconductor film comprising a first oxide semiconductor film and a second oxide semiconductor film over the first oxide semiconductor film;
performing a plasma treatment on the stacked oxide semiconductor film;
forming a source electrode and a drain electrode over the stacked oxide semiconductor film; and
forming an oxide film comprising gallium oxide over the stacked oxide semiconductor film, the source electrode and the drain electrode,
wherein the first oxide semiconductor film includes crystals which are c-axis aligned,
wherein the second oxide semiconductor film includes crystals which are c-axis aligned, and
wherein the oxide film includes one or more elements selected from constituent metal element of the second oxide semiconductor film.

11. The method for manufacturing a semiconductor device according to claim 10, the method further comprising the steps of forming an electrode over the oxide film,
wherein the electrode overlaps with the gate electrode.

12. The method for manufacturing a semiconductor device according to claim 10, wherein oxygen is added to the second oxide semiconductor film by the plasma treatment.

13. The method for manufacturing a semiconductor device according to claim 10, further comprising the step of performing a plasma treatment on the gate insulating layer before forming the stacked oxide semiconductor film whereby at least one of halogen and oxygen is added to the gate insulating layer.

14. The method for manufacturing a semiconductor device according to claim 10, wherein the plasma treatment is performed using a high-density plasma CVD apparatus.

15. The method for manufacturing a semiconductor device according to claim 10,
wherein each of the first oxide semiconductor film and the second oxide semiconductor film contains indium, gallium and zinc.

16. The method for manufacturing a semiconductor device according to claim 10,
wherein the crystals in the first oxide semiconductor film are c-axis aligned perpendicularly to a surface of the first oxide semiconductor film, and
wherein the crystals in the second oxide semiconductor film are c-axis aligned perpendicularly to a surface of the second oxide semiconductor film.

* * * * *